United States Patent
Chun et al.

(10) Patent No.: US 11,676,932 B2
(45) Date of Patent: Jun. 13, 2023

(54) SEMICONDUCTOR INTERCONNECT STRUCTURES WITH NARROWED PORTIONS, AND ASSOCIATED SYSTEMS AND METHODS

(71) Applicant: Micron Technology, Inc., Boise, ID (US)

(72) Inventors: Hyunsuk Chun, Boise, ID (US); Thiagarajan Raman, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/806,764

(22) Filed: Mar. 2, 2020

(65) Prior Publication Data
US 2021/0202430 A1 Jul. 1, 2021

Related U.S. Application Data

(60) Provisional application No. 62/955,889, filed on Dec. 31, 2019.

(51) Int. Cl.
*H01L 23/00* (2006.01)

(52) U.S. Cl.
CPC ............ *H01L 24/67* (2013.01); *H01L 24/06* (2013.01); *H01L 2924/3512* (2013.01)

(58) Field of Classification Search
CPC ......... H01L 24/01–17; H01L 24/64–70; H01L 2224/1301–13019; H01L 2224/13075–13084; H01L 2224/1401; H01L 2224/17517
See application file for complete search history.

(56) References Cited

U.S. PATENT DOCUMENTS

| | | | | | |
|---|---|---|---|---|---|
| 5,162,257 | A | * | 11/1992 | Yung | H01L 24/03 438/613 |
| 5,293,006 | A | * | 3/1994 | Yung | H01L 24/03 174/261 |
| 5,341,979 | A | * | 8/1994 | Gupta | H01L 24/11 228/111 |
| 5,497,546 | A | * | 3/1996 | Kubo | H01L 21/486 219/85.13 |
| 5,640,052 | A | * | 6/1997 | Tsukamoto | H01L 24/81 257/781 |
| 5,656,798 | A | * | 8/1997 | Kubo | H01L 21/486 174/263 |
| 5,684,677 | A | * | 11/1997 | Uchida | H05K 3/303 361/770 |

(Continued)

*Primary Examiner* — Andres Munoz
(74) *Attorney, Agent, or Firm* — Perkins Coie LLP

(57) ABSTRACT

Semiconductor devices having interconnect structures with narrowed portions configured to mitigate thermomechanical stresses, and associated systems and methods, are disclosed herein. In one embodiment, a semiconductor package includes a semiconductor die and a pillar structure coupled to the semiconductor die. The pillar structure can include an end portion away from the semiconductor die, the end portion having a first cross-sectional area. The pillar structure can further include a narrowed portion between the end portion and the semiconductor die, the narrowed portion having a second cross-sectional area less than the first-cross-sectional area of the end portion. A bond material can be coupled to the end portion of the pillar structure.

15 Claims, 9 Drawing Sheets

(56) References Cited

U.S. PATENT DOCUMENTS

| | | | | |
|---|---|---|---|---|
| 5,821,627 | A * | 10/1998 | Mori | H05K 3/328 |
| | | | | 257/780 |
| 5,968,670 | A * | 10/1999 | Brofman | H01L 24/16 |
| | | | | 428/576 |
| 5,975,409 | A * | 11/1999 | Brofman | H01L 24/75 |
| | | | | 228/180.22 |
| 6,444,924 | B1 * | 9/2002 | Ishida | H01L 23/49827 |
| | | | | 174/262 |
| 6,513,701 | B2 * | 2/2003 | Mead | B23K 1/0056 |
| | | | | 228/248.1 |
| 7,427,557 | B2 * | 9/2008 | Rinne | H01L 24/13 |
| | | | | 438/612 |
| 7,834,454 | B2 * | 11/2010 | Rinne | H01L 24/11 |
| | | | | 257/737 |
| 8,012,797 | B2 * | 9/2011 | Shen | H01L 21/4853 |
| | | | | 438/107 |
| 8,258,055 | B2 * | 9/2012 | Hwang | H01L 24/03 |
| | | | | 438/613 |
| 8,487,432 | B2 * | 7/2013 | Rinne | H01L 24/13 |
| | | | | 257/737 |
| 8,723,318 | B2 * | 5/2014 | Haba | H01L 23/49811 |
| | | | | 257/737 |
| 8,922,008 | B2 * | 12/2014 | Myung | H01L 24/11 |
| | | | | 257/737 |
| 9,013,037 | B2 * | 4/2015 | Jin | H01L 23/3114 |
| | | | | 257/737 |
| 9,093,385 | B2 * | 7/2015 | Gissibl | H01L 21/28568 |
| 9,236,304 | B2 * | 1/2016 | Kim | H01L 21/78 |
| 9,406,629 | B2 * | 8/2016 | Tseng | H01L 24/02 |
| 9,917,071 | B1 * | 3/2018 | Chiu | H01L 24/83 |
| 9,935,043 | B1 * | 4/2018 | Imafuji | H01L 23/3185 |
| 9,935,044 | B2 * | 4/2018 | Lin | H01L 24/73 |
| 9,978,709 | B2 * | 5/2018 | Yang | H01L 24/13 |
| 10,037,973 | B2 * | 7/2018 | Tseng | H01L 24/16 |
| 10,049,997 | B2 * | 8/2018 | Choi | H01L 24/13 |
| 10,115,647 | B2 * | 10/2018 | Huang | H01L 23/49811 |
| 10,993,332 | B2 * | 4/2021 | Yang | H05K 3/32 |
| 11,018,099 | B2 * | 5/2021 | Tsao | H01L 23/145 |
| 2002/0000462 | A1 * | 1/2002 | Mead | H05K 3/3485 |
| | | | | 228/248.1 |
| 2003/0129823 | A1 * | 7/2003 | Amador | H01L 24/11 |
| | | | | 438/689 |
| 2005/0215045 | A1 * | 9/2005 | Rinne | H01L 24/13 |
| | | | | 438/614 |
| 2009/0229853 | A1 * | 9/2009 | Fukuda | B23K 1/0016 |
| | | | | 174/126.1 |
| 2010/0171207 | A1 * | 7/2010 | Shen | H01L 21/565 |
| | | | | 257/686 |
| 2011/0122592 | A1 * | 5/2011 | Ganesan | H01L 24/16 |
| | | | | 361/767 |
| 2012/0007230 | A1 * | 1/2012 | Hwang | H01L 24/13 |
| | | | | 257/737 |
| 2012/0032322 | A1 * | 2/2012 | Lin | H01L 24/17 |
| | | | | 257/737 |
| 2013/0062764 | A1 * | 3/2013 | Jin | H01L 24/03 |
| | | | | 257/738 |
| 2013/0099376 | A1 * | 4/2013 | Haba | H01L 21/4853 |
| | | | | 257/737 |
| 2013/0256878 | A1 * | 10/2013 | Hsu | H01L 24/08 |
| | | | | 257/737 |
| 2013/0292822 | A1 * | 11/2013 | Myung | H01L 24/05 |
| | | | | 257/737 |
| 2014/0035131 | A1 * | 2/2014 | Noh | H01L 23/49811 |
| | | | | 257/737 |
| 2014/0199796 | A1 * | 7/2014 | Kim | H01L 21/78 |
| | | | | 438/27 |
| 2014/0357055 | A1 * | 12/2014 | Gissibl | H01L 21/3065 |
| | | | | 438/462 |
| 2016/0111384 | A1 * | 4/2016 | Tseng | H01L 24/13 |
| | | | | 257/737 |
| 2016/0148891 | A1 * | 5/2016 | Tsao | H01L 24/11 |
| | | | | 257/737 |
| 2016/0218055 | A1 * | 7/2016 | Lin | H05K 1/111 |
| 2016/0276248 | A1 * | 9/2016 | Huang | H01L 23/5389 |
| 2016/0307864 | A1 * | 10/2016 | Chiu | H01L 23/3157 |
| 2016/0336298 | A1 * | 11/2016 | Tseng | H01L 23/3142 |
| 2017/0012019 | A1 * | 1/2017 | Yang | H01L 24/13 |
| 2017/0278814 | A1 * | 9/2017 | Hung | H01L 24/11 |
| 2017/0358545 | A1 * | 12/2017 | Choi | H01L 24/05 |
| 2018/0096926 | A1 * | 4/2018 | Imafuji | H01L 21/4853 |
| 2019/0096832 | A1 * | 3/2019 | Tsao | H01L 24/13 |
| 2019/0206820 | A1 * | 7/2019 | Guevara, III | H01L 24/14 |
| 2020/0154578 | A1 * | 5/2020 | Yang | H05K 3/40 |

* cited by examiner

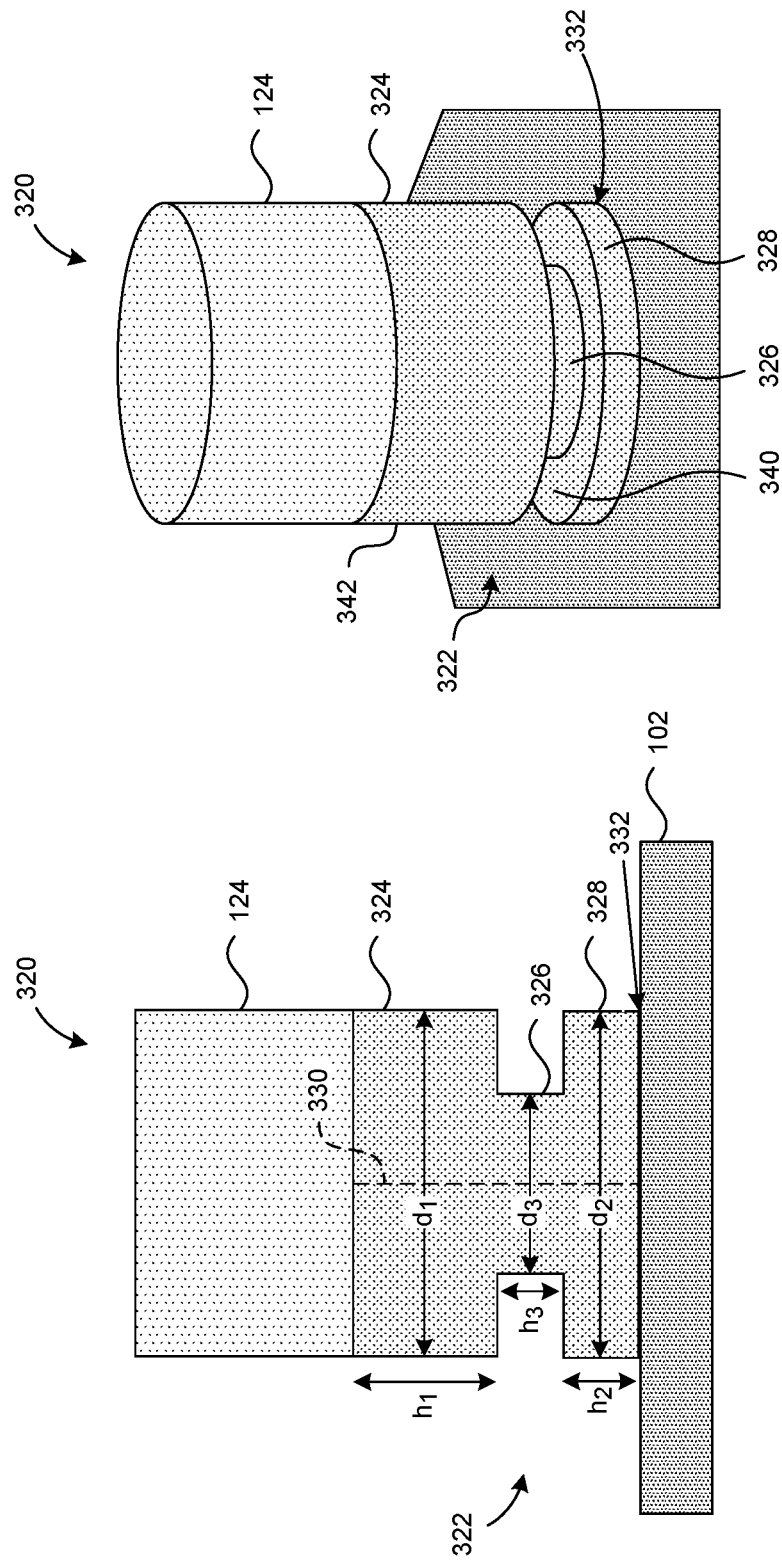

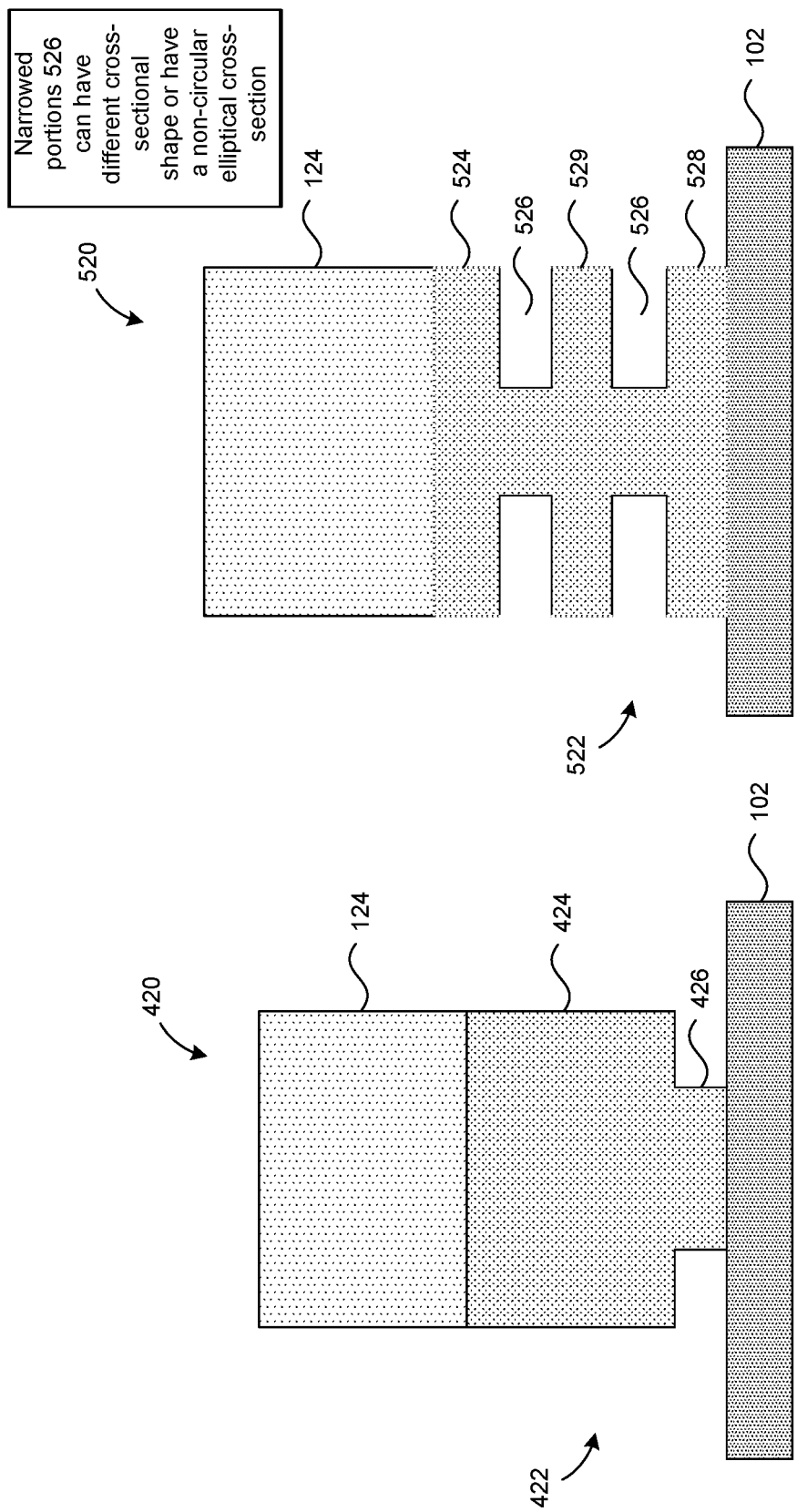

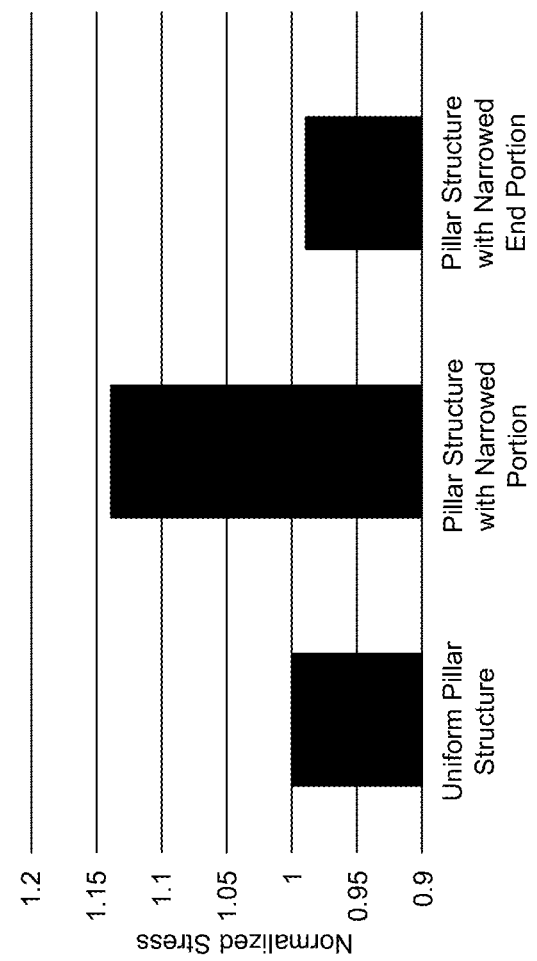
FIG. 7D
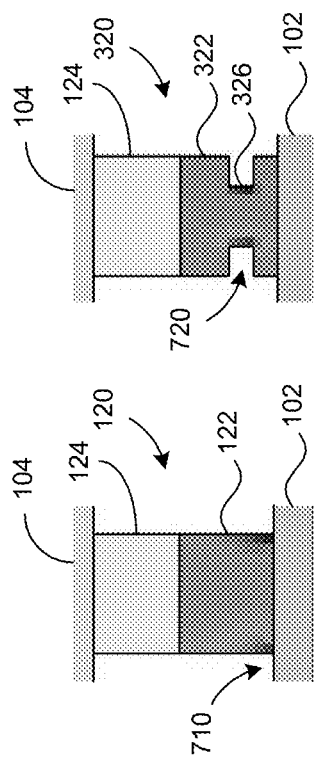
FIG. 7A
FIG. 7B
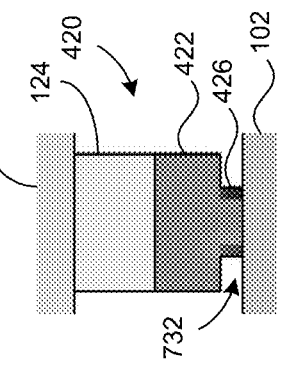
FIG. 7C

SEMICONDUCTOR INTERCONNECT STRUCTURES WITH NARROWED PORTIONS, AND ASSOCIATED SYSTEMS AND METHODS

CROSS-REFERENCE TO RELATED APPLICATION(S)

This application claims the benefit of U.S. Provisional Application No. 62/955,889, filed Dec. 31, 2019, which is incorporated herein by reference in its entirety.

TECHNICAL FIELD

The present technology generally relates to semiconductor devices, and more particularly relates to semiconductor devices having interconnect structures configured to mitigate thermomechanical stresses.

BACKGROUND

Packaged semiconductor dies, including memory chips, microprocessor chips, and imager chips, typically include a semiconductor die mounted on a substrate and encased in a protective covering. The semiconductor die can include functional features, such as memory cells, processor circuits, and imager devices, as well as bond pads electrically connected to the functional features. The bond pads can be electrically connected to terminals outside the protective covering to allow the semiconductor die to be connected to higher level circuitry.

In some semiconductor packages, the bond pads of a semiconductor die can be electrically coupled to an organic substrate or another semiconductor die via various bonding methods such as a thermo-compression bonding (TCB), reflow, or diffusion bonding. During the bonding operation, conductive pillars are formed on the bond pads and coupled to the substrate via a bond material that is disposed between the conductive pillars and the substrate. To attach the bond material to the substrate, the semiconductor package is heated to heat and reflow the bond material. However, heating the semiconductor package and/or subsequently cooling the semiconductor package can induce significant mechanical stress between the semiconductor die and the substrate due to a mismatch in the coefficients of thermal expansion of these components. Often, the stress can induce cracking of the semiconductor die near one or more of the bond pads, which can render the semiconductor package inoperable.

BRIEF DESCRIPTION OF THE DRAWINGS

Many aspects of the present technology can be better understood with reference to the following drawings. The components in the drawings are not necessarily to scale. Instead, emphasis is placed on illustrating clearly the principles of the present technology.

FIG. 3A is a side cross-sectional of an interconnect structure with a narrowed portion configured in accordance with embodiments of the present technology.

FIG. 3B is a perspective view of the interconnect structure of FIG. 3A.

FIG. 4 is a side cross-sectional view of another interconnect structure with a narrowed portion configured in accordance with embodiments of the present technology.

FIG. 5 is a side cross-sectional view of an interconnect structure with a plurality of narrowed portions configured in accordance with embodiments of the present technology.

FIG. 7A is a heat map showing a simulated stress distribution in the interconnect structure of FIG. 2.

FIG. 7B is a heat map showing a simulated stress distribution in the interconnect structure of FIG. 3A.

FIG. 7C is a heat map showing a simulated stress distribution in the interconnect structure of FIG. 4.

FIG. 7D is a histogram showing maximum stresses in the simulated stress distributions of FIGS. 7A-7C.

DETAILED DESCRIPTION

Figure 1A:
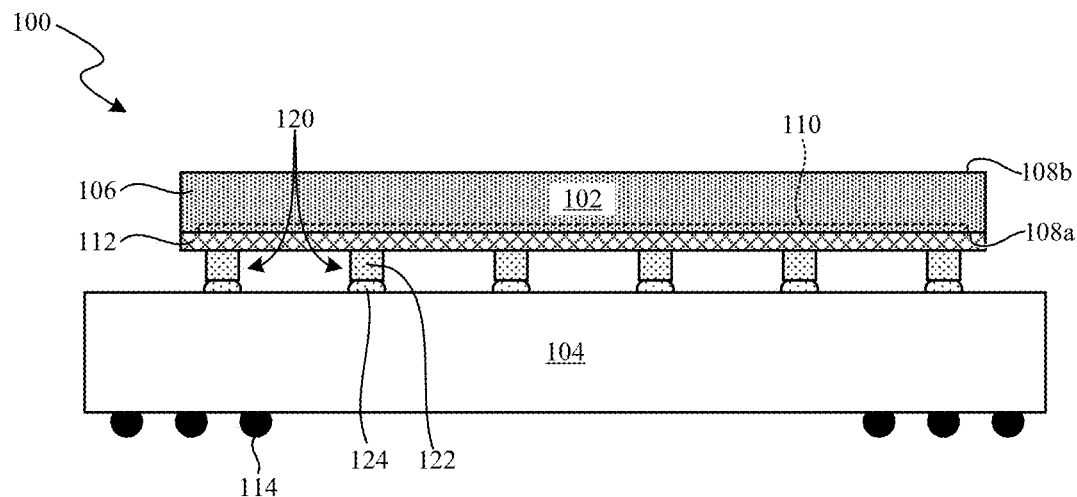
FIG. 1A is a side cross-sectional view of a semiconductor package configured in accordance with embodiments of the present technology.

Specific details of several embodiments of semiconductor devices, and associated systems and methods, are described below. A person skilled in the relevant art will recognize that suitable stages of the methods described herein can be performed at the wafer level or at the die level. Therefore, depending upon the context in which it is used, the term "substrate" can refer to a wafer-level substrate or to a singulated, die-level substrate. Furthermore, unless the context indicates otherwise, structures disclosed herein can be formed using conventional semiconductor-manufacturing techniques. Materials can be deposited, for example, using chemical vapor deposition, physical vapor deposition, atomic layer deposition, plating, electroless plating, spin coating, and/or other suitable techniques. Similarly, materials can be removed, for example, using plasma etching, wet etching, chemical-mechanical planarization, or other suitable techniques. A person skilled in the relevant art will also understand that the technology may have additional embodiments, and that the technology may be practiced without several of the details of the embodiments described below with reference to FIGS. 1A-9.

In several of the embodiments described below, a semiconductor package configured in accordance with the present technology can include a semiconductor die and an interconnect structure coupled to the semiconductor die. The interconnect structure can include a pillar structure with one or more narrowed portions configured to decrease stiffness and/or increase flexibility of the pillar structure. As a result, when the package is subjected to stress (e.g., thermomechanical stress), the pillar structure can bend and/or deform to dissipate at least some of the stress, thereby reducing the amount of stress applied to the interface with the semiconductor die that may be mechanically weaker than the pillar structure. The interconnect structures of the present technology are expected to reduce yield loss during manufacturing of semiconductor packages (e.g., after a TCB bonding step and/or reflow step, as a result of thermal cycling and/or thermal shock during package reliability tests, etc.) and to increase the reliability of semiconductor packages during operation (e.g., during power cycling during end-customer use).

Although certain embodiments herein are described with respect to interconnect structures between a semiconductor die and a package substrate, the present technology is also applicable to interconnect structures between other components of a semiconductor package, e.g., between two semiconductor dies.

Numerous specific details are disclosed herein to provide a thorough and enabling description of embodiments of the present technology. A person skilled in the art, however, will understand that the technology may have additional embodiments and that the technology may be practiced without several of the details of the embodiments described below with reference to FIGS. 1A-9. For example, some details of semiconductor devices and/or packages well known in the art have been omitted so as not to obscure the present technology. In general, it should be understood that various other devices and systems in addition to those specific embodiments disclosed herein may be within the scope of the present technology.

As used herein, the terms "vertical," "lateral," "upper," "lower," "above," and "below" can refer to relative directions or positions of features in the semiconductor devices in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation.

FIG. 1A is a side cross-sectional view of a semiconductor package 100 ("package 100") in accordance with embodiments of the present technology. The package 100 can include a semiconductor die 102 carried by a package substrate 104. In the illustrated embodiment, the semiconductor die 102 includes a semiconductor substrate 106 (e.g., a silicon substrate, a gallium arsenide substrate, an organic laminate substrate, etc.) having a first side or surface 108a and a second side or surface 108b opposite the first side 108a.

The first side 108a of the semiconductor substrate 106 can be an active side or region including one or more circuit elements 110 (e.g., wires, traces, interconnects, transistors, etc.) (shown schematically) formed in and/or on the first side 108a. The circuit elements 110 can include, for example, memory circuits (e.g., dynamic random memory (DRAM) or other type of memory circuits), controller circuits (e.g., DRAM controller circuits), logic circuits, and/or other circuits. In other embodiments, the semiconductor substrate 106 can be a "blank" substrate that does not include integrated circuit components and that is formed from, for example, crystalline, semi-crystalline, and/or ceramic substrate materials, such as silicon, polysilicon, aluminum oxide ($Al_2O_3$), sapphire, and/or other suitable materials.

In the illustrated embodiment, the semiconductor die 102 further includes an insulating material 112 formed over at least a portion of the first side 108a of the semiconductor substrate 106. The insulating material 112 can include one or more layers of a suitable dielectric material (e.g., a passivation material, a polyimide material, and/or other materials used to cover a surface of a semiconductor device). For example, the insulating material 112 can comprise silicon oxide, silicon nitride, poly-silicon nitride, poly-silicon oxide, tetraethyl orthosilicate (TEOS), etc. In some embodiments, the insulating material 112 can at least partially comprise a dielectric material with a small dielectric constant relative to silicon oxide (a "low-κ dielectric material"). Such low-κ dielectric materials can include fluorine-doped silicon dioxide, carbon-doped silicon dioxide, porous silicon dioxide, organic polymeric dielectrics, silicon based polymeric dielectrics, etc. Notably, low-κ dielectric materials can increase the performance of the package 100, but can be mechanically fragile, e.g., compared to conventional (e.g., higher-κ) dielectric materials. Accordingly, the insulating material 112 can be relatively prone to mechanical failure (e.g., cracking, delamination, etc. due to thermomechanical stresses) compared to other portions/components of the package 100, as described further herein.

The package substrate 104 can include a redistribution layer, an interposer, a printed circuit board, a dielectric spacer, another semiconductor die (e.g., a logic die), or another suitable substrate. The package substrate 104 can further include electrical connectors 114 (e.g., solder balls, conductive bumps, conductive pillars, conductive epoxies, and/or other suitable electrically conductive elements) electrically coupled to the package substrate 104 and configured to electrically couple the package 100 to external devices or circuitry (not shown).

The semiconductor die 102 can be electrically coupled to the package substrate 104 via a plurality of interconnect structures 120 (e.g., bumps, micro-bumps, pillars, columns, studs, etc.). For example, in some embodiments, the semiconductor die 102 includes a plurality of bond pads (not shown) electrically coupled to the circuit elements 110 of the semiconductor die 102. The bond pads can be at least partially exposed through openings in the insulating material 112, such that at least some of the interconnect structures 120 are electrically coupled to corresponding bond pads (e.g., directly or indirectly via an under-bump material (UBM)). The interconnect structures 120 can also be electrically coupled to bond pads (not shown) formed on the package substrate 104, thereby electrically coupling the circuit elements 110 on the semiconductor die 102 to the package substrate 104. Optionally, at least some of the interconnect structures 120 can be "dummy" structures that are not electrically coupled to electrically active bond pads on the semiconductor die 102 and/or package substrate 104. While six interconnect structures 120 are illustrated in FIG. 1A, the package 100 can include fewer or more interconnect structures 120. For example, the package 100 can include tens, hundreds, thousands, or more interconnect structures 120 arrayed between the semiconductor die 102 and the package substrate 104.

In the illustrated embodiment, each of the interconnect structures 120 includes a pillar structure 122 (also known as a "pillar") and a bond material 124 (e.g., SnAg-based solder). The pillar structure 122 can be coupled to the semiconductor die 102, and the bond material 124 can be coupled to the package substrate 104. Each pillar structure 122 can be formed of any suitably conductive material such as, for example, copper, nickel, gold, silicon, tungsten, conductive-epoxy, combinations thereof, etc., and can be formed from using an electroplating, electroless-plating, or other suitable process. In some embodiments, the interconnect structures 120 can also include barrier materials (e.g., nickel, nickel-based intermetallic, and/or gold) formed over end portions of the pillar structures 122. The barrier materials can facilitate bonding and/or prevent or at least inhibit the electromigration of copper or other metals used to form the pillar structures 122.

In the illustrated embodiment, the first side 108a of the semiconductor substrate 106 faces the package substrate 104 (e.g., in a direct chip attach (DCA) configuration). In other embodiments, the semiconductor die 102 can be arranged differently. For example, the second side 108b of the semiconductor substrate 106 can face the package substrate 104 and the semiconductor die 102 can include one or more through-silicon vias (TSVs) extending through the semiconductor substrate 106 to electrically couple the circuit elements 110 to the interconnect structures 120. Moreover, while only a single semiconductor die 102 is shown in FIG. 1A, in other embodiments, the package 100 can include a plurality of semiconductor dies, e.g., one or more additional semiconductor dies stacked on and/or over the semiconductor die 102.

The package 100 can include other components typically found in semiconductor devices and known to one of skill in the art. For example, the package 100 can further include an underfill or molded material formed over the package substrate 104 and/or at least partially around the semiconductor die 102. In some embodiments, the package 100 includes other components such as external heatsinks, a casing (e.g., thermally conductive casing), electromagnetic interference (EMI) shielding components, etc.

In some embodiments, the package 100 is subjected to thermomechanical stress (e.g., chip-package interaction (CPI) stress) during manufacturing and/or usage. Thermomechanical stresses may be induced, for example, by the assembly process (e.g., DCA methods such as TCB/mass reflow), by thermal cycling and/or thermal shock during component/board level reliability testing, and/or by power cycling during end-customer usage.

Figure 1B:
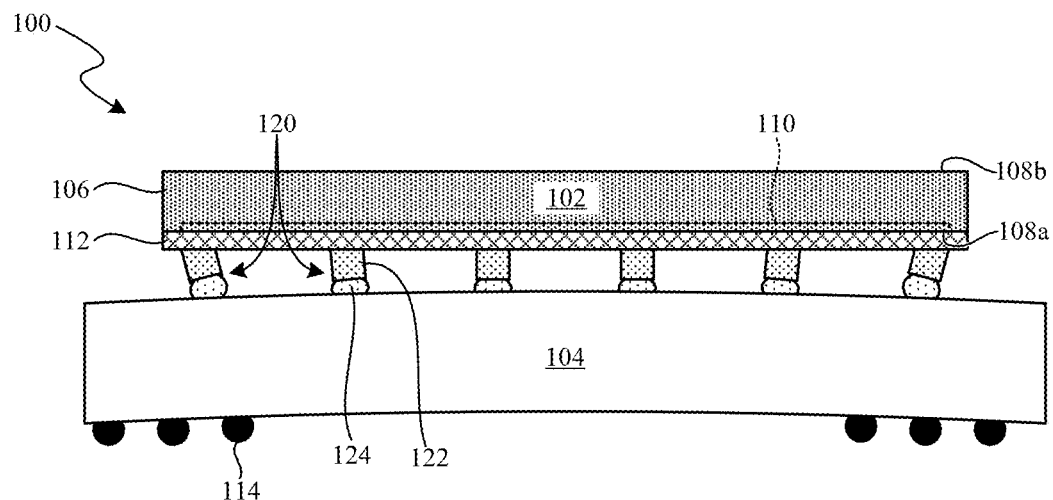
FIG. 1B is a side cross-sectional view of the semiconductor package of FIG. 1A after a TCB/reflow operation.

For example, referring to FIGS. 1A and 1B together, the package 100 is illustrated at the beginning and end, respectively, of a TCB/reflow operation. In FIG. 1A, heating of the package 100 has caused the bond material 124 in the interconnect structures 120 to reflow and electrically connect the pillar structures 122 to the package substrate 104. In some embodiments, the package 100 can be heated to 200° C. or greater (e.g., to 217° C. or greater) to reflow the bond material 124. During the TCB operation, a compressive force can be applied to secure the interconnect structures 120 to the package substrate 104. In FIG. 1B, the package 100 is illustrated at the completion of the TCB operation, after the compressive force has been applied and after cooling the package 100 (e.g., to about 25° C.). By cooling the package 100 at this point, the bond material 124 can be solidified, securing the semiconductor die 102 to the package substrate 104.

In some embodiments, the semiconductor die 102 has a coefficient of thermal expansion (CTE) that is different than the CTE of the package substrate 104, and the CTE mismatch between these components can cause them to deform (e.g., warp, bend) relative to one another during cooling and/or heating of the package 100. For example, the CTE of the semiconductor die 102 (e.g., about 3 ppm/° C.) can be lower than the CTE of the package substrate 104 (e.g., about 14 ppm/° C.). Accordingly, as shown in FIG. 1B, the package substrate 104 can have a warped, non-planar shape after cooling. In other embodiments, the semiconductor die 102, or both the semiconductor die 102 and the package substrate 104, can have a non-planar, warped shape after cooling. The relative deformation of the semiconductor die 102 and the package substrate 104 can introduce mechanical (e.g., thermomechanical) stresses into the package 100 (e.g., CPI stresses) that laterally stress and bend the interconnect structures 120. This can cause cracks to form and propagate at the interface between the interconnect structures 120 and the semiconductor die 102, which can cause mechanical and/or electrical failures within the package 100.

Figure 2:
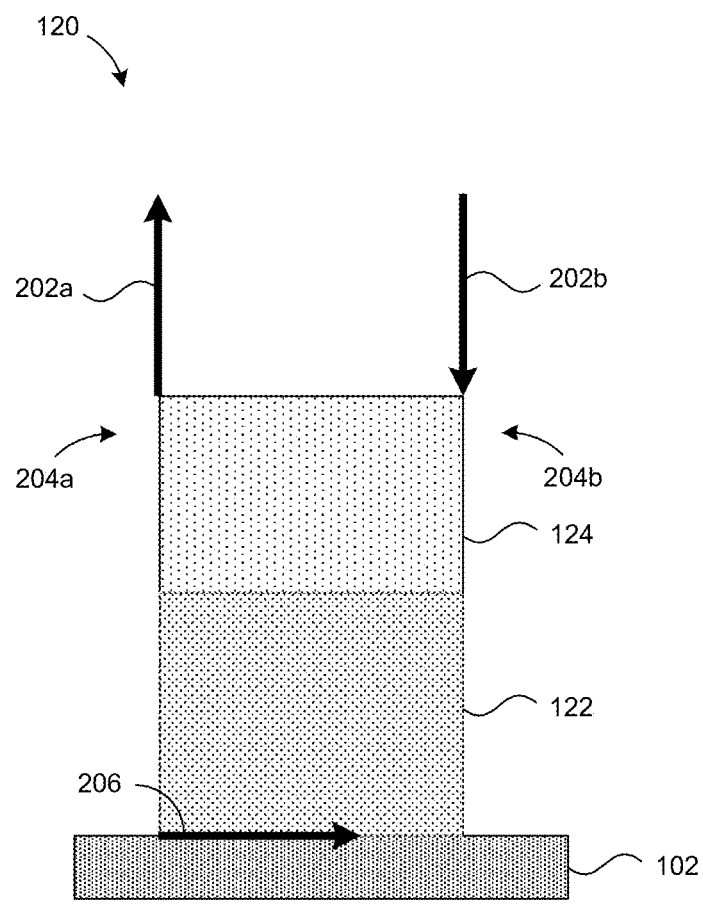
FIG. 2 is a side cross-sectional view of an interconnect structure of FIG. 1A subjected to thermomechanical stress.

FIG. 2 is a side cross-sectional view of an interconnect structure 120 of FIG. 1A shown in an inverted orientation relative to FIG. 1A. As previously described with respect to FIG. 1A, the interconnect structure 120 includes a pillar structure 122 and a bond material 124 (the vertical orientation of FIG. 2 is inverted relative to FIG. 1A). In the illustrated embodiment, the pillar structure 122 has an elongated shape with a uniform cross-sectional area. For example, the pillar structure 122 can be generally cylindrical with a circular or elliptical cross-sectional shape. The pillar structure 122 can have a uniform diameter or width along its height. The pillar structure 122 can be coupled to the semiconductor die 102 (e.g., to an insulating material and/or bond pad at the surface of the semiconductor die 102). The bond material 124 can be coupled to the package substrate (not shown). Optionally, the interconnect structure 120 can be surrounded by an underfill material (not shown).

FIG. 2 also illustrates an example of the thermomechanical stress during a TCB operation. The thermomechanical stress causes a tensile force 202a to be applied at a first side portion 204a of the interconnect structure 120 and a compressive force 202b to be applied at a second, opposite side portion 204b of the interconnect structure 120. At least some of the tensile force 202a can be transmitted through the bond material 124 to the pillar structure 122. In some embodiments, the pillar structure 122 is made of a material having a relatively high elastic modulus (e.g., copper), such that pillar structure 122 is relatively stiff and transmits most of the applied force to the semiconductor die 102. In embodiments where the pillar structure 122 is coupled to a material with a relatively low elastic modulus (e.g., an insulating material on the surface of semiconductor die 102), the force applied by the pillar structure 122 can cause mechanical failure of the material. For example, one or more cracks can form at or near the interface between the pillar structure 122 and the material. The cracks can originate at or near the first side portion 204a and propagate through the material along the direction indicated by arrow 206 towards the second side portion 204b. Cracking of the material can cause mechanical and/or electrical failure of the semiconductor die 102, rendering the package fully or partially inoperable. For example, the interconnect structure 120 can fully or partially rip out of the semiconductor die 102.

In some embodiments, the present technology provides interconnect structures configured to mitigate the effects of thermomechanical stress (e.g., due to CTE mismatch) and reduce the likelihood of mechanical failure. For example, the interconnect structures described herein can be designed to cause thermomechanical stress to be concentrated in and/or absorbed by the relatively mechanically strong pillar structure, rather than being transmitted to the relatively mechanically weak components of the semiconductor die (e.g., the insulating material). In some embodiments, the pillar structure includes one or more narrowed portions designed to decrease stiffness and/or increase flexibility of the pillar structure, such that applied forces are at least partially dissipated by deformation (e.g., elastic and/or plastic deformation) of the pillar structure. As a result, the various embodiments described herein are expected to increase package yield, robustness, and reliability.

FIGS. 3A and 3B are side cross-sectional and perspective views, respectively, of an interconnect structure 320 with a narrowed portion 326 configured in accordance with embodiments of the present technology. The interconnect structure 320 includes a pillar structure 322 coupled to the semiconductor die 102 (e.g., to an insulating material and/or bond pad at the surface of the semiconductor die 102) and a bond material 124 coupled to the package substrate (not shown). The pillar structure 322 can be made of a conductive metal, such as copper, nickel, cobalt, etc. The interconnect structure 320 can be surrounded by an underfill material (not shown).

The pillar structure 322 can have an elongated shape with a first end portion 324, a narrowed portion 326, and a second end portion 328. The first end portion 324 can be located away from the semiconductor die 102, with the bond material 124 being disposed on the first end portion 324. The second end portion 328 can be opposite the first end portion 324 and can be coupled to the semiconductor die 102 (e.g., to an insulating material and/or bond pad at the surface of the semiconductor die 102). The narrowed portion 326 can be disposed between the first end portion 324 and the second end portion 328.

The narrowed portion 326 can be designed to mitigate stresses applied to the interconnect structure 320 in order to avoid failure (e.g., fracture, cracking) at or near the interface between the pillar structure 322 and the semiconductor die 102. For example, in some embodiments, the narrowed portion 326 has a smaller cross-sectional dimension (e.g., cross-sectional area, width, diameter, etc.) than the first end portion 324 and/or the second end portion 328. For example, the first end portion 324 can have a first cross-sectional area, the second end portion 328 can have a second cross-sectional area, and the narrowed portion 326 can have a third cross-sectional area smaller than the first and/or second cross-sectional areas. The cross-sectional area of the narrowed portion 326 can be no more than 10%, 20%, 30%, 40%, 50%, 60%, 70%, 80%, or 90% of the cross-sectional area of the first end portion 324 and/or the second end portion 328. The first end portion 324 and the second end portion 328 can have the same cross-sectional area. In other embodiments, the cross-sectional area of the first end portion 324 can be different than (e.g., greater than or less than) the cross-sectional area of the second end portion 328. For example, the cross-sectional area of the first end portion 324 can be no more than 10%, 20%, 30%, 40%, 50%, 60%, 70%, 80%, or 90% of the cross-sectional area of the second end portion 328, or vice-versa.

Referring to FIG. 3B, the pillar structure 322 can have a generally cylindrical shape, such that the first end portion 324, narrowed portion 326, and second end portion 328 each have a circular cross-sectional shape. Accordingly, the first end portion 324 can have a first diameter $d_1$, the second end portion 328 can have a second diameter $d_2$, and the narrowed portion 326 can have a third diameter $d_3$ smaller than $d_1$ and/or $d_2$. For example, $d_3$ can be no more than 10%, 20%, 30%, 40%, 50%, 60%, 70%, 80%, or 90% of $d_1$ and/or $d_2$. The first end portion 324 and the second end portion 328 can have the same diameter. In other embodiments, the diameter of the first end portion 324 can be different than (e.g., greater than or less than) the diameter of the second end portion 328. For example, $d_1$ can be no more than 10%, 20%, 30%, 40%, 50%, 60%, 70%, 80%, or 90% of $d_2$, or vice-versa.

In some embodiments, the narrowed portion 326 reduces the stiffness and/or increases the flexibility of the pillar structure 322. Accordingly, when stress is applied to the pillar structure 322 (e.g., as previously described with respect to FIG. 2), the pillar structure 322 is expected to deform (e.g., elastically and/or plastically deform) at or near the narrowed portion 326. The deformation of the pillar structure 322 can dissipate at least a portion of the force applied to the pillar structure 322, thereby reducing the force that is transmitted to the semiconductor die 102 (e.g., to an insulating material on the surface of the semiconductor die 102). Additionally, an underfill material surrounding the narrowed portion 326, which can generally have a lower elastic modulus than the material of the pillar structure 322, can also provide a cushioning effect that absorbs forces. As a result, the likelihood of the failure (e.g., cracking, fracture) at or near the interface between the pillar structure 322 and semiconductor die 102 can be reduced.

The present technology encompasses many different configurations for the pillar structure 322. In other embodiments, the first end portion 324, narrowed portion 326, and/or second end portion 328 can have other geometries. For example, the first end portion 324, narrowed portion 326, and/or second end portion 328 can each independently have a circular, elliptical, square, rectangular, polygonal, rectilinear, or curvilinear shape, or a combination thereof. The first end portion 324, narrowed portion 326, and/or second end portion 328 can each have the same cross-sectional shape. Alternatively, two or more of the first end portion 324, narrowed portion 326, and/or second end portion 328 can have different cross-sectional shapes. It shall be appreciated that the embodiments described herein with respect to circular cross-sectional shapes can be modified to apply to embodiments having other cross-sectional shapes (e.g., substituting width for diameter, perimeter for circumference, etc.).

The other dimensions of the first end portion 324, narrowed portion 326, and second end portion 328 can each be independently varied as desired. For example, the first end portion 324 can have a first height $h_1$, the second end portion 328 can have a second height $h_2$, and the narrowed portion 326 can have a third height $h_3$. In some embodiments, $h_3$ can be at least 10%, 20%, 30%, 40%, 50%, 60%, 70%, 80%, or 90% of the total height of the pillar structure 322 ($h_1+h_2+h_3$). In some embodiments, $h_3$ can be no more than 10%, 20%, 30%, 40%, 50%, 60%, 70%, 80%, or 90% of $h_1$ and/or $h_2$. The first end portion 324 and the second end portion 328 can have the same height, or can have different heights. For example, $h_1$ can be no more than 10%, 20%, 30%, 40%, 50%, 60%, 70%, 80%, or 90% of $h_2$, or vice-versa.

The positioning of the narrowed portion 326 along the vertical axis 330 of the pillar structure 322 can be varied as desired. In the illustrated embodiment, the narrowed portion 326 is positioned such that the uppermost part of the narrowed portion 326 is at or near the midpoint of the vertical axis 330 (e.g., $h_1=h_2+h_3$). In other embodiments, the narrowed portion 326 can be located at other positions along the vertical axis 330, e.g., such that the narrowed portion 326 is closer to the bonding material 124 than the semiconductor die 102, or vice-versa.

Additionally, although the illustrated embodiment shows the first end portion 324, narrowed portion 326, and second end portion 328 as being coaxial with each other, in alternative embodiments, the first end portion 324, narrowed portion 326, and/or second end portion 328 can be axially offset from each other. For example, the first end portion 324 and second end portion 328 can be coaxial with each other, while the narrowed portion 326 can be axially offset from the first end portion 324 and second end portion 328.

Referring again to FIG. 3B, in the illustrated embodiment, the pillar structure 322 has an elongated shape (e.g., a cylindrical shape), and the narrowed portion 326 is defined by a groove or trench 340 formed in the outer surface 342 of the elongated shape. Although FIG. 3B illustrates the groove 340 as extending along the entire circumference of the pillar structure 322, in other embodiments, the groove 340 can extend along only a portion of the circumference of the pillar structure 322. For example, the groove 340 can extend no more than 10%, 20%, 30%, 40%, 50%, 60%, 70%, 80%, or 90% along the circumference. In such embodiments, the groove 340 can be located at or near one or more parts of the pillar structure 322 that are expected to be subjected to stress (e.g., a side or surface where a tension force is expected to be applied). As a result, in embodiments where different locations of the semiconductor package are subjected to different stresses, the location of the groove 340 can be varied based on the position of the interconnect structure 320 within the semiconductor package. Additionally, although the groove 340 is depicted as having a uniform shape along its entire length, in other embodiments, the groove 340 can have different shapes along its length. For example, the groove 340 can be taller and/or deeper at or near locations subjected to stress, and can be shorter and/or shallower away from locations subjected to stress.

FIG. 4 is a side cross-sectional view of another interconnect structure 420 with a narrowed portion 426 configured in accordance with embodiments of the present technology. The interconnect structure 420 can be generally similar to the interconnect structure 320 described with respect to FIGS. 3A and 3B. Accordingly, like numbers (e.g., narrowed portion 326 versus narrowed portion 426) are used to identify similar or identical components, and discussion of the interconnect structure 420 illustrated in FIG. 4 will be limited to those features that differ from the embodiments described with respect to FIGS. 3A and 3B.

The interconnect structure 420 includes a pillar structure 422 with an end portion 424 and a narrowed portion 426. The end portion 424 can be located away from the semiconductor die 102, with a bond material 124 being disposed on the end portion 424. The narrowed portion 426 can be coupled to the semiconductor die 102 (e.g., to an insulating material and/or bond pad at the surface of the semiconductor die 102).

Similar to the embodiments described with respect to FIGS. 3A and 3B, the narrowed portion 426 can be designed to mitigate stresses applied to the interconnect structure 420 to avoid failure (e.g., fracture, cracking) at or near the interface between the pillar structure 422 and the semiconductor die 102. In some embodiments, the narrowed portion 426 is expected to reduce the stiffness of the pillar structure 422, thereby reducing the load transmitted to the semiconductor die 102. For example, as previously described herein, the narrowed portion 426 can have a smaller cross-sectional dimension (e.g., cross-sectional area, width, diameter, etc.) than the end portion 424. The cross-sectional dimension of the narrowed portion 426 can be no more than 10%, 20%, 30%, 40%, 50%, 60%, 70%, 80%, or 90% of the cross-sectional dimension of the end portion 424.

The pillar structure 422 can be configured in many different ways, similar to the embodiments described with respect to FIGS. 3A and 3B. For example, the end portion 424 and/or narrowed portion 426 can each independently have a circular, elliptical, square, rectangular, polygonal, rectilinear, or curvilinear shape, or a combination thereof. As another example, the end portion 424 and the narrowed portion 426 can have the same height, or can have different heights. In some embodiments, the height of the narrowed portion 426 is no more than 10%, 20%, 30%, 40%, 50%, 60%, 70%, 80%, or 90% of the height of the end portion 424, or vice-versa. As yet another example, the narrowed portion 426 can be defined by a groove or trench that extends partially or entirely around the outer circumference or periphery of the pillar structure 422.

FIG. 5 is a side cross-sectional view of an interconnect structure 520 with a plurality of narrowed portions 526 configured in accordance with embodiments of the present technology. The interconnect structure 520 can be generally similar to the embodiments described with respect to FIGS. 3A-4. Accordingly, like numbers are used to identify similar or identical components, and discussion of the interconnect structure 520 illustrated in FIG. 5 will be limited to those features that differ from the embodiments described with respect to FIGS. 3A-4.

The interconnect structure 520 includes a pillar structure 522 with a first end portion 524, a plurality of narrowed portions 526, and a second end portion 528. The first end portion 524 can be located away from the semiconductor die 102, with a bond material 124 being disposed on the end portion 524. The second end portion 528 can be opposite the first end portion 524 and can be coupled to the semiconductor die 102 (e.g., to an insulating material and/or bond pad at the surface of the semiconductor die 102). In other embodiments, the second end portion 528 can be omitted, such that the pillar structure 522 is coupled to the semiconductor die by one of the narrowed portions 526 (e.g., similar to FIG. 4).

The plurality of narrowed portions 526 can be disposed between the first end portion 524 and the second end portion 528. One or more medial portions 529 can be interspersed between pairs of narrowed portions 526. In the illustrated embodiment, the pillar structure 522 includes a single medial portion 529 disposed between two narrowed portions 526. In other embodiments, the pillar structure 522 can include different numbers of narrowed portions 526 and medial portions 529. For example, the pillar structure 522 can include three, four, five, six, seven, eight, nine, ten, or more narrowed portions 526. The pillar structure 522 can include two, three, four, five, six, seven, eight, nine, ten, or more medial portions 529.

Similar to the other embodiments described herein, the narrowed portions 526 can be designed to mitigate stresses applied to the interconnect structure 520 in order to avoid failure (e.g., fracture, cracking) at or near the interface between the pillar structure 522 and the semiconductor die 102. In some embodiments, the narrowed portions 526 are expected to reduce the stiffness of the pillar structure 522, thereby reducing the load transmitted to the semiconductor die 102. For example, each narrowed portion 526 can have a smaller cross-sectional dimension (e.g., cross-sectional area, width, diameter, etc.) than the first end portion 524, second end portion 528, and/or medial portion(s) 529. The cross-sectional dimension of each narrowed portion 526 can be no more than 10%, 20%, 30%, 40%, 50%, 60%, 70%, 80%, or 90% of the first end portion 524, second end portion 528, and/or medial portion(s) 529.

In some embodiments, the narrowed portions 526 each have the same geometry (e.g., cross-sectional dimension, cross-sectional shape, height, etc.). In other embodiments, some or all of the narrowed portions 526 can have different geometries. For example, each narrowed portion 526 can have the same diameter. Alternatively, some or all of the narrowed portions 526 can have different diameters. As another example, the narrowed portions 526 can all have the same cross-sectional shape (e.g., circular, elliptical, square, rectangular, polygonal, rectilinear, or curvilinear, or a combination thereof), or some or all of the narrowed portion 526 can have different cross-sectional shapes. As yet another example, although the illustrated embodiment depicts the narrowed portions 526 as all having the same height, in other embodiments, some or all of the narrowed portions 526 can have different heights. In yet another example, each narrowed portion 526 can be defined by a groove or trench that extends partially or entirely around the outer circumference or periphery of the pillar structure 522, and the location and length of each groove can be independently varied as desired.

Similarly, the configuration of the first end portion 524, second end portion 528, and/or medial portion(s) 529 can be modified in many different ways. For example, the geometry (e.g., cross-sectional dimension, cross-sectional shape, height, etc.) of the first end portion 524, second end portion 528, and/or each of the medial portion(s) 529 can each be independently varied as desired. In the illustrated embodiment, first end portion 524, second end portion 528, and/or the medial portion(s) 529 each have the same geometry. In other embodiments, two or more of the first end portion 524, second end portion 528, and/or each of the medial portion(s) 529 can have different geometries. For example, the first end portion 524 and second end portion 528 can have the same geometry, while the medial portion(s) 529 can have a different geometry. In embodiments where the pillar structure 522 includes a plurality of medial portions 529, each medial portion 529 can have the same geometry, which can be the same as or different from the geometry of the first end portion 524 and/or second end portion 528. In other embodiments, some or all of the medial portions 529 can have different geometries.

It shall be appreciated that the various features of the embodiments described with respect to FIGS. 3A-5 can be combined with each other. Additionally, in some embodiments, pillar structures of different interconnect structures within a single semiconductor package can have different geometries, e.g., depending on the location of the interconnect structure within the semiconductor package. For example, interconnect structures that are expected to be subjected to significant stresses and/or tensile forces (e.g., interconnect structures at or near the edges of the package) can have pillar structures with one or more narrowed portions to mitigate stress, while interconnect structures that are not expected to be subjected to significant stresses and/or tensile forces (e.g., interconnect structures away from the edges and/or at or near the center of the package) can have pillar structures with uniform cross-sectional shapes (e.g., without any narrowed portions).

Figure 6C:
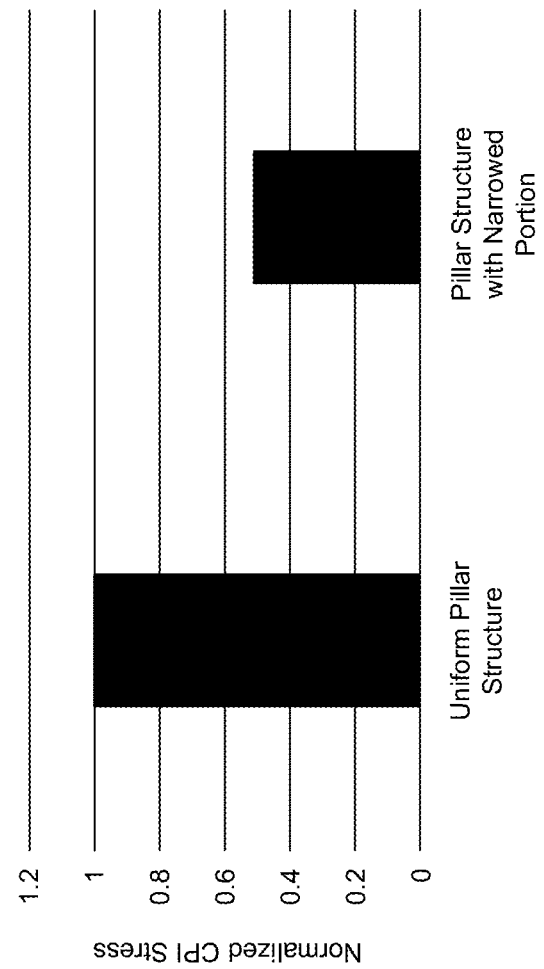
FIG. 6C is a histogram showing simulated maximum CPI stresses for different interconnect structures in the absence of underfill material.
Figure 6A:
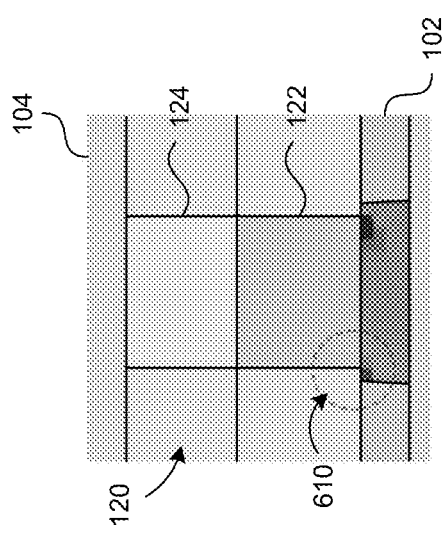
FIG. 6A is a heat map showing a simulated CPI stress distribution in a circuitry region of a semiconductor die coupled to the interconnect structure of FIG. 2.
Figure 6B:
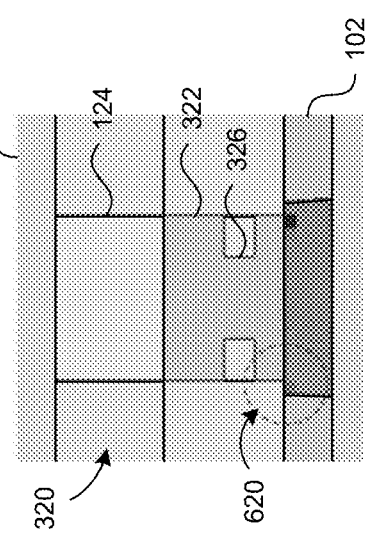
FIG. 6B is a heat map showing a simulated CPI stress distribution in a circuitry region of a semiconductor die coupled to the interconnect structure of FIG. 3A.
Figure 6D:
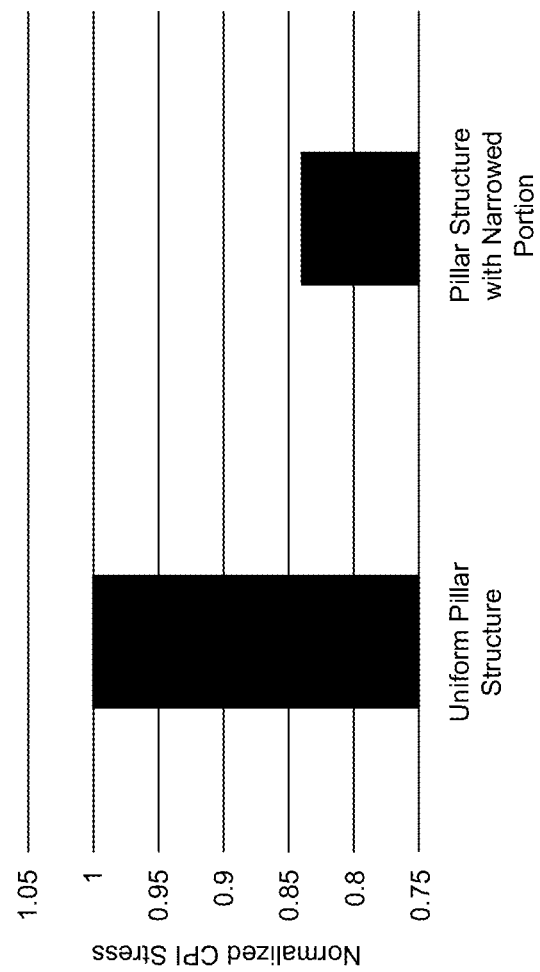
FIG. 6D is a histogram showing simulated maximum CPI stresses for different interconnect structures in the presence of underfill material.

FIGS. 6A-6D illustrate simulated CPI stress distributions within the interface between the semiconductor die and interconnect structures configured in accordance with embodiments of the present technology. FIG. 6A is a heat map showing interfacial CPI stress distribution in a circuitry region of a semiconductor die 102 coupled to an interconnect structure 120 with a uniform pillar structure 122, as previously described with respect to FIG. 2. The location of maximum CPI stress is indicated by arrow 610. FIG. 6B is a heat map showing interfacial CPI stress distribution in a circuitry region of a semiconductor die 102 coupled to an interconnect structure 320 with a pillar structure 322 having a narrowed portion 326, as previously described with respect to FIGS. 3A and 3B. The location of maximum CPI stress is indicated by arrow 620. As can be seen in FIGS. 6A and 6B, the maximum CPI stress is reduced for the interconnect structure 320 with the narrowed pillar structure 322 (FIG. 6B) compared to the interconnect structure 120 with the uniform pillar structure 122 (FIG. 6A). Referring to FIG. 6C, in the absence of underfill material surrounding the interconnect structure, the maximum CPI stress at the interface is reduced by approximately 50% for the pillar structure 322, compared to the pillar structure 122. Referring to FIG. 6D, in the presence of underfill material, which is expected to provide a cushioning effect due to its relatively low elastic modulus, the maximum CPI stress at the interface is reduced by approximately 15% for the pillar structure 322, compared to the pillar structure 122.

FIGS. 7A-7D illustrate simulated stress distributions in interconnect structures configured in accordance with embodiments of the present technology. FIG. 7A is a heat map showing stress distribution in an interconnect structure 120 with a uniform pillar structure 122, as previously described with respect to FIG. 2. The location of maximum stress is indicated by arrow 710. FIG. 7B is a heat map showing stress distribution in an interconnect structure 320 with a pillar structure 322 having a narrowed portion 326, as previously described with respect to FIGS. 3A and 3B. The location of maximum stress is indicated by arrow 720. FIG. 7C is a heat map showing stress distribution in an interconnect structure 420 with a pillar structure 422 having a narrowed portion 426 coupled to the semiconductor die 102 ("narrowed end portion"), as previously described with respect to FIG. 4. The location of maximum stress is indicated by arrow 730.

Referring to FIGS. 7A, 7B, and 7D together, the maximum stress is approximately 15% higher in the pillar structure 322 with narrowed portion 326, compared to the uniform pillar structure 122. However, the likelihood of failure is expected to be lower for pillar structure 322 because the stress is concentrated in the material of the pillar structure 322 (e.g., copper), which has higher fracture toughness compared to the material of the semiconductor die 102 (e.g., insulating material). In contrast, although the uniform pillar structure 122 exhibits a lower maximum stress, this stress is concentrated at the interface between the pillar structure 122 and the semiconductor die 102, and is therefore more likely to result in failure.

Referring to FIGS. 7A, 7C, and 7D together, the maximum stress is similar in the pillar structure 422 with narrowed end portion 426, compared to the uniform pillar structure 122. However, the likelihood of failure is expected to be lower for pillar structure 422 because the narrow end portion 426 exhibits greater flexibility, thereby allowing more stress to be dissipated by deformation of the end portion 426, rather than being transmitted to the mechanically fragile semiconductor die interface.

Figure 8:
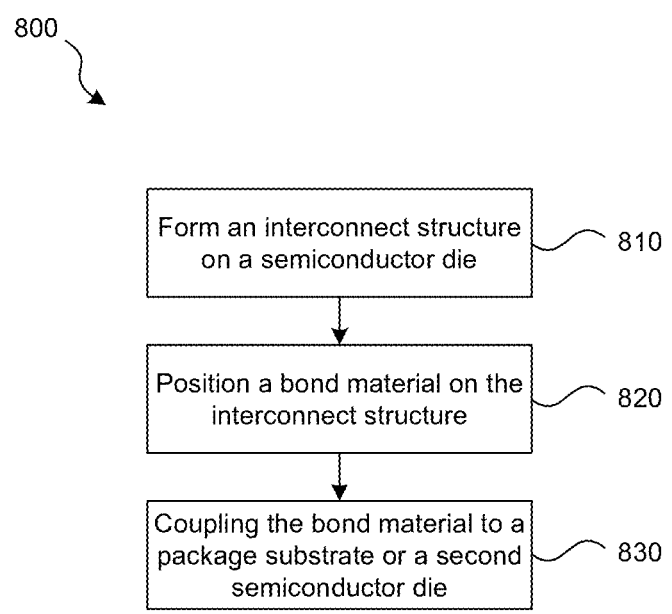
FIG. 8 is a block diagram illustrating a method of manufacturing a semiconductor package, in accordance with embodiments of the present technology.

FIG. 8 is a block diagram illustrating a method 800 of manufacturing a semiconductor package, in accordance with embodiments of the present technology. The method 800 can be used to manufacture any embodiment of the semiconductor packages described herein, or one or more components thereof (e.g., one or more interconnect structures). The method 800 includes forming a pillar structure on a semiconductor die (block 810). The pillar structure can be formed using any suitable method known to those of skill in the art. For example, the pillar structure can be formed by depositing a material, e.g., using chemical vapor deposition, physical vapor deposition, atomic layer deposition, plating, electroless plating, spin coating, and/or other suitable techniques. Alternatively or in combination, the pillar structure can be formed by a material removal process, e.g., using plasma etching, wet etching, chemical-mechanical planarization, or other suitable techniques. The pillar structure can be configured according to any of the embodiments described with respect to FIGS. 3A-5. For example, the pillar structure can include an end portion and a narrowed portion. The end portion can be positioned away from the semiconductor die, and the narrowed portion can be positioned between the end portion and the semiconductor die. The end portion can have a first cross-sectional dimension (e.g., cross-sectional area, diameter, width, etc.), and the narrowed portion can have a second cross-sectional dimension less than the first cross-sectional dimension.

In some embodiments, the pillar structure is formed by forming the narrowed portion, then forming the end portion after forming the narrowed portion. For example, the narrowed portion can be formed by depositing a pillar material (e.g., copper, nickel) using a first mask geometry (e.g., a mask geometry having holes with the second cross-sectional dimension). Subsequently, the end portion can be formed by depositing the pillar material using a second mask geometry (e.g., a mask geometry having holes with the second cross-sectional dimension). As another example, the pillar structure can be formed by depositing a pillar material on the semiconductor die, then removing a portion of the pillar material to form the narrowed portion (e.g., by etching).

Optionally, the pillar structure can include a second end portion, with the narrowed portion being located between the first and second end portions (e.g., as previously described with respect to FIGS. 3A and 3B). The second end portion can have a third cross-sectional dimension greater than the second cross-sectional dimension of the narrowed portion. In such embodiments, the method 800 can include forming the second end portion prior to forming the narrowed portion (e.g., by depositing a pillar material using a third mask geometry, such as a mask geometry having holes with the third cross-sectional dimension). In other embodiments, the pillar structure can omit the second end portion, such that the narrowed portion is formed on the semiconductor die (e.g., as previously described with respect to FIG. 4).

In some embodiments, the pillar structure can include a plurality of narrowed portions (e.g., as previously described with respect to FIG. 5). To form such a pillar structure, the method 800 can include a plurality of sequential deposition steps in which different mask geometries are used to alternatingly deposit narrowed portions and other pillar structure portions (e.g., end portions and/or medial portions). Optionally, the method 800 can include removing a plurality of portions of pillar material to form the plurality of narrowed portions.

The method 800 can further include positioning a bond material on the pillar structure (block 820), using any suitable method known to those of skill in the art. The bond material can be positioned on the end portion of the pillar structure. The method 800 can further include coupling the bond material to a package substrate or a second semiconductor die (block 830) (e.g., using a TCB operation). Optionally, this can result in electrical coupling of the semiconductor die to the package substrate or the second semiconductor die.

Figure 9:
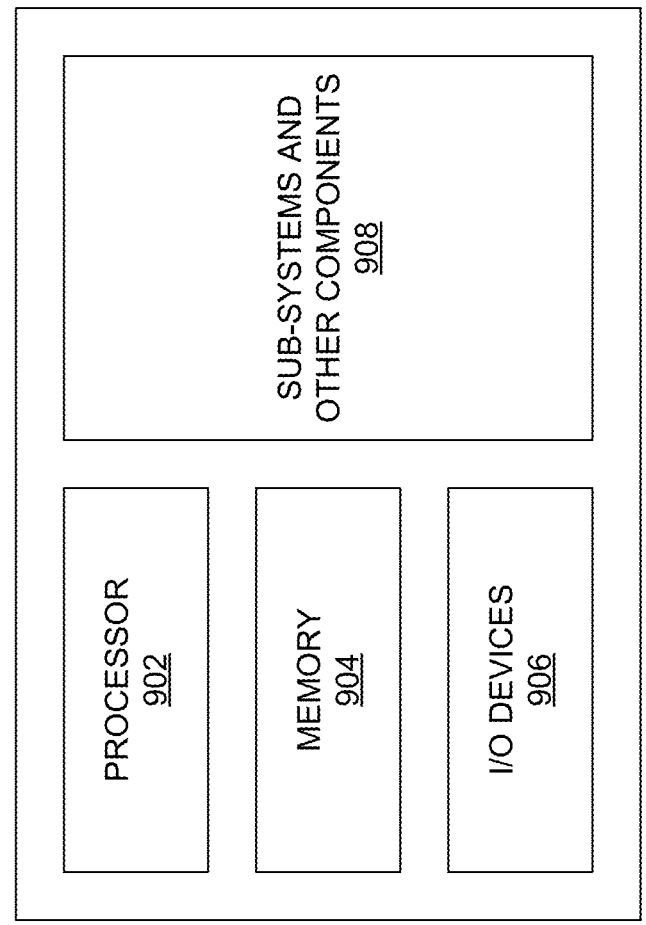
FIG. 9 is a schematic view of a system that includes a semiconductor device or package configured in accordance with embodiments of the present technology.

Any one of the semiconductor devices and/or packages having the features described above with reference to FIGS. 1A-5 can be incorporated into any of a myriad of larger and/or more complex systems, a representative example of which is system 900 shown schematically in FIG. 9. The system 900 can include a processor 902, a memory 904 (e.g., SRAM, DRAM, flash, and/or other memory devices), input/output devices 906, and/or other subsystems or components 908. The semiconductor dies and/or packages described above with reference to FIGS. 1A and 3A-6 can be included in any of the elements shown in FIG. 9. The resulting system 900 can be configured to perform any of a wide variety of suitable computing, processing, storage, sensing, imaging, and/or other functions. Accordingly, representative examples of the system 900 include, without limitation, computers and/or other data processors, such as desktop computers, laptop computers, Internet appliances, hand-held devices (e.g., palm-top computers, wearable computers, cellular or mobile phones, personal digital assistants, music players, etc.), tablets, multi-processor systems, processor-based or programmable consumer electronics, network computers, and minicomputers. Additional representative examples of the system 900 include lights, cameras, vehicles, etc. With regard to these and other example, the system 900 can be housed in a single unit or distributed over multiple interconnected units, e.g., through a communication network. The components of the system 900 can accordingly include local and/or remote memory storage devices and any of a wide variety of suitable computer-readable media.

From the foregoing, it will be appreciated that specific embodiments of the technology have been described herein for purposes of illustration, but that various modifications may be made without deviating from the disclosure. Accordingly, the invention is not limited except as by the appended claims. Furthermore, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

We claim:

1. A semiconductor package, comprising:
   a semiconductor die;
   a pillar structure coupled to the semiconductor die, wherein the pillar structure includes:
   a first end portion away from the semiconductor die, the first end portion having a first cross-sectional area,
   a first narrowed portion between the first end portion and the semiconductor die, the first narrowed portion having a second cross-sectional area less than the first-cross-sectional area of the first end portion,
   a second end portion coupled to the semiconductor die, the second end portion having a third cross-sectional area greater than the second cross-sectional area of the first narrowed portion,
   a second narrowed portion between the first end portion and the first narrowed portion, the second narrowed portion having a fourth cross-sectional area less than the first cross-sectional area of the first end portion and the third cross-sectional area of the second end portion, and
   a medial portion between the first narrowed portion and the second narrowed portion, the medial portion having a fifth cross-sectional area greater than the second cross-sectional area of the first narrowed portion and the fourth cross-sectional area of the second narrowed portion, wherein the pillar structure comprises a seamless structure, and wherein the first and second narrowed portions are defined by respective grooves formed in the seamless structure, and wherein the first end portion, the second end portion, and the medial portion each have a cylindrical shape; and a bond material coupled to the first end portion of the pillar structure.

2. The semiconductor package of claim 1 wherein the pillar structure comprises a conductive metal.

3. The semiconductor package of claim 1 wherein the pillar structure comprises a cylindrical shape, and the first narrowed portion is defined by a groove formed in the seamless structure.

4. The semiconductor package of claim 3 wherein the groove extends along an entire circumference of an outer surface of the cylindrical shape.

5. The semiconductor package of claim 3 wherein the groove extends along only a portion of a circumference of an outer surface of the cylindrical shape.

6. The semiconductor package of claim 1 wherein the pillar structure is coupled to an insulating material on a surface of the semiconductor die.

7. The semiconductor package of claim 1 wherein the pillar structure is electrically coupled to a bond pad on a surface of the semiconductor die.

8. The semiconductor package of claim 1, wherein the first narrowed portion has a first cross-section, and wherein the second narrowed portion has a second cross-section with a shape that is different than a shape of the first cross-section.

9. The semiconductor package of claim 1, wherein a first cross-section of the first narrowed portion or a second cross-section of the second narrowed portion have a non-circular elliptical shape.

10. A method of manufacturing a semiconductor package, the method comprising:

forming a pillar structure on a semiconductor die, wherein the pillar structure includes:

a first end portion away from the semiconductor die, the first end portion having a first cross-sectional area, a first narrowed portion between the first end portion and the semiconductor die, the first narrowed portion having a second cross-sectional area less than the first-cross-sectional area of the first end portion, a second end portion coupled to the semiconductor die, the second end portion having a third cross-sectional area greater than the second cross-sectional area of the first narrowed portion, a second narrowed portion between the first end portion and the first narrowed portion, the second narrowed portion having a fourth cross-sectional area less than the first cross-sectional area of the first end portion and the third cross-sectional area of the second end portion, and a medial portion between the first narrowed portion and the second narrowed portion, the medial portion having a fifth cross-sectional area greater than the second cross-sectional area of the first narrowed portion and the fourth cross-sectional area of the second narrowed portion, wherein the pillar structure comprises a seamless structure, and wherein the first and second narrowed portions are defined by respective grooves formed in the seamless structure, and wherein the first end portion, the second end portion, and the medial portion each have a cylindrical shape; and positioning a bond material on the first end portion of the pillar structure.

11. The method of claim 10 wherein forming the pillar structure comprises:

forming the first narrowed portion, and forming the first end portion after forming the first narrowed portion.

12. The method of claim 11 wherein forming the pillar structure further comprises forming the second end portion on the semiconductor die prior to forming the first narrowed portion.

13. The method of claim 10 wherein forming the pillar structure comprises:

depositing a pillar material on the semiconductor die; and removing a portion of the pillar material to form the first narrowed portion.

14. The method of claim 10, further comprising coupling the bond material to a package substrate or a second semiconductor die.

15. The method of claim 14, further comprising electrically coupling the semiconductor die to the package substrate or the second semiconductor die.

* * * * *